United States Patent [19]
Sakata

[11] Patent Number: 5,400,285
[45] Date of Patent: Mar. 21, 1995

[54] SEMICONDUCTOR INTEGRATED CIRCUIT DEVICE

[75] Inventor: Toshikazu Sakata, Miyazaki, Japan

[73] Assignee: Oki Electric Industry Co., Ltd., Tokyo, Japan

[21] Appl. No.: 152,014

[22] Filed: Nov. 15, 1993

[30] Foreign Application Priority Data

Nov. 17, 1992 [JP] Japan .................................. 4-307263

[51] Int. Cl.⁶ .............................................. G11C 7/00
[52] U.S. Cl. .................. 365/205; 365/189.01; 365/189.05; 365/196
[58] Field of Search ........... 365/205, 196, 227, 189.05, 365/230.08, 189.01

[56] References Cited

U.S. PATENT DOCUMENTS 5,307,317 4/1994 Shiraishi et al. ..................... 365/205
5,313,431 5/1994 Uruma et al. ..................... 365/205 X Primary Examiner—Do Hyun Yoo
Attorney, Agent, or Firm—Steven M. Rabin

[57] ABSTRACT

A semiconductor integrated circuit device includes a sense amplifier for amplifying the data stored in a memory cell, activated in accordance with a binary output enable signal fed to the integrated circuit device, in order to reduce the power consumption thereof. When the output enable signal is at a first level, in which the output of the integrated circuit device becomes in a floating state after a memory cell is selected to be read out, the sense amplifier is disabled to reduce the power consumption. The sense amplifier is disabled in response to a signal from a control circuit, which produces a logical output signal based on output enable signal and a control signal used to activate the sense amplifier only for the read operation. While the sense amplifier is temporarily disabled, the output of the sense amplifier is latched by a latch circuit, which is also controlled by the output enable signal, to guarantee an output enable access time.

19 Claims, 7 Drawing Sheets

READ OPERATION

WRITE OPERATION

WRITE OPERATION

FIG. 8

| OPERATION MODE | OS~ | WE~ | OE~ | OPERATION |
|---|---|---|---|---|
| DATA MAINTENANCE | H | | | OUTPUT FLOATING |
| READ CYCLE | L | H | H | OUTPUT FLOATING |
| | L | H | L | READ DATA |
| WRITE CYCLE | L | L | | WRITE DATA |

DONT CARE (EITHER OR 'H' OR 'L')

SEMICONDUCTOR INTEGRATED CIRCUIT DEVICE

CROSS REFERENCE TO RELATED APPLICATION

This application claims the priority benefits of Japanese application No. 4-307263, filed Nov. 17, 1992, the entire disclosure of which is incorporated herein by reference.

BACKGROUND OF THE INVENTION

1. Field of the Invention

This invention relates to a semiconductor integrated circuit device such as a static random access memory (hereinafter called "SRAM") having a plurality of memory cells, each including of a flip-flop for data storage.

2. Description of Related Art

In a conventional SRAM, a memory cell array is arranged in a matrix configuration on a chip, and each memory cell is accessed by using one word-line and a pair of bit-lines selected on the basis of a decoded address signal. In the case of a complementary metal oxide semiconductor field-effect transistor (CMOS) SRAM, each memory cell typically contains as a storage circuit a flip-flop, composed of a pair of p-channel metal oxide semiconductor field effect transistors (PMOS transistors) and a pair of n-channel metal oxide semiconductor field effect transistors (NMOS transistors), and a further pair of NMOS transistors functioning as transfer gates. In each memory cell, the NMOS transistors of the transfer gates, connect the flip-flop storage circuit with the corresponding bit-lines, and are controlled by connection of their gates to the respective corresponding word-lines.

One end of each bit-line is connected to a power supply voltage line which provides a supply voltage Vcc, through an NMOS transistor as a load. The other end of each bit-line is connected to a corresponding one of a pair of data-lines, through a respective NMOS transistor functioning as a transfer gate. Each such pair of transfer gates for a pair of the bit-lines, is controlled by the same column signal, to be turned on and off.

The data on some bit-line pairs require amplification and for the purpose the bit-lines are connected to a sense amplifier. Each pair of bit-lines is also connected, through a pair of data-lines, to a write driver, for writing data to each memory cell.

In such a device, the sense amplifier is activated by a control signal CN. The control signal CN is produced in response to a write enable signal $WE_N$ (active low) and a chip select signal $CS\sim$ (active low). The sense amplifier amplifies a voltage difference between the data-lines.

The write driver is activated in response to an inverted control signal $CN_N$. The signal $CN_N$ is obtained from an inverter that receives the control signal CN. The write driver delivers data to the data-lines on a pair of write data-lines.

During a read cycle of the device (also referred herein as a "read operation"), the control signal CN goes to a high level HIGH as selected between the binary logic levels, thereby turning the sense amplifier on (active). The write driver is not activated since the inverted control signal $CN_N$ is LOW. During a write cycle of the device (also referred to herein as a "write operation"), in turn, the control signal CN goes to the low level (LOW) of the binary logic levels, thereby turning the sense amplifier off (inactive), whereas the write driver is activated according to the inverted control signal $CN_N$.

In such a conventional SRAM, the sense amplifier is turned on and off only by the control signal CN. The control signal maintains the same level throughout the entire read cycle, that is as long as the write enable signal $WE_N$ (active low) is HIGH (indicating the read cycle) and the chip select signal $CS\sim$ (active low) is LOW (indicating the chip is selected). Therefore, the sense amplifier is continuously activated during the read cycle, even while the output enable signal $OE\sim$ (active low) is HIGH, indicating that the output of the chip is disabled and in a floating state. (The output enable signal $OE\sim$ is well known in circuits of this type). Such maintenance of the sense amplifier in an active state, while the chip output is disabled, is wasteful of power consumption.

During an initial portion of the read cycle, immediately after the write cycle, pairs of the data-lines and the bit-lines retain large voltage differences as a result of the write cycle. When the voltage on a word-line or a column-line shifts, to close a corresponding transfer gate, malfunctions in writing to the memory cell may occur, because the capacitance of the memory cell is much less than that of the bit-lines or the dam-lines, and such memory cell capacitance is thereby easily charged or discharged due to the large voltage differences at which those line and memory cell capacitances are coupled with each other. Therefore, to protect memory cells from such malfunctions in the conventional SRAM, the read operation is delayed for a predetermined "write recovery" time period, immediately after the data is written. This write recovery time period, however, prevents the SRAM from operating at a high speed.

SUMMARY OF THE INVENTION

It is an object of the invention to reduce power consumption in a semiconductor integrated circuit memory device having a sense amplifier. More particularly, it is an object of the invention to reduce power consumption in such a device, during an initial period of a read cycle, while the output of the device or chip is in a floating state.

It is another object of the invention to provide a semiconductor integrated circuit device capable of prompt recovery of bit-lines and data-lines during an initial period of the read cycle, immediately after the write cycle, thereby being capable of operating at a high speed.

The foregoing objects are accomplished with a semiconductor is integrated circuit device including a plurality of word-lines, a plurality of bit-lines intersecting the word-lines, and a plurality of memory cells, each connected to a word-line and a pair of the bit-lines. An output enable signal, according to its signal level, enables an output of the device to be in a floating state. A sense amplifier for amplifying the voltage difference between the bit-lines, is connected to a selected memory cell. The sense amplifier is turned on and off (made active and inactive) by the output of a logic circuit, to which are inputted a control signal and the output enable signal. In other words, the sense amplifier is activated only when the control signal and the output enable signal allow the sense amplifier to be active, even while the device output is in the floating state. Therefore, the power consumption is reduced by holding the sense amplifier temporarily inactive.

According to a preferred embodiment, the sense amplifier is connected to a latch circuit. The latch circuit is provided, at an output of the sense amplifier, for holding output levels of the sense amplifier. The latch circuit is controlled by the output enable signal and activated at a time that the output enable signal indicates that the output of the device is in the floating state, thereby to ensure a period of access to the output of the device.

According to another aspect of the invention, a semiconductor integrated circuit device includes a plurality of first and second word-lines, bit-line pairs intersecting the word-lines, memory cells having transfer gates connected to the first and second word-lines and to first and second bit lines of a bit-line pair, and a cell selection circuit for selecting a memory cell to be accessed, by selecting one of the first word-lines for application of a transfer gate controlling signal, that turns one transfer gate on, during a write operation, and selecting one pair of first and second word-lines for application of transfer gate controlling signals, that turn both transfer gates on, during a read operation, in accordance with address data fed to the device.

The device also includes a write data-line for providing data to be stored in a memory cell. The write data-line is connected to each memory cell through only one bit-line of each bit-line pair. The transfer gate connected to the one bit-line provides access to the memory cell under control of the first word-line.

Therefore, during the write operation, only the one bit-line of a bit-line pair is connected to the write data-line and is used for writing the data to the corresponding memory cell. The other bit-line of the pair is not connected during the write operation. Therefore, the voltage difference between the bit-lines, which could otherwise cause the memory cells to malfunction, is reduced. It is accordingly possible to operate the device with a short write recovery period, so that the device is capable of operating at high speed.

BRIEF DESCRIPTION OF THE DRAWINGS

The above and other objects and features of the invention will be apparent to those skilled in the art from the following detailed description of the preferred embodiments, when considered in conjunction with the accompanied drawings, in which:

FIG. 8 is a function table illustrating the read and write operations of the SRAM of FIG. 1.

DESCRIPTION OF THE PREFERRED EMBODIMENTS

Figure 1:
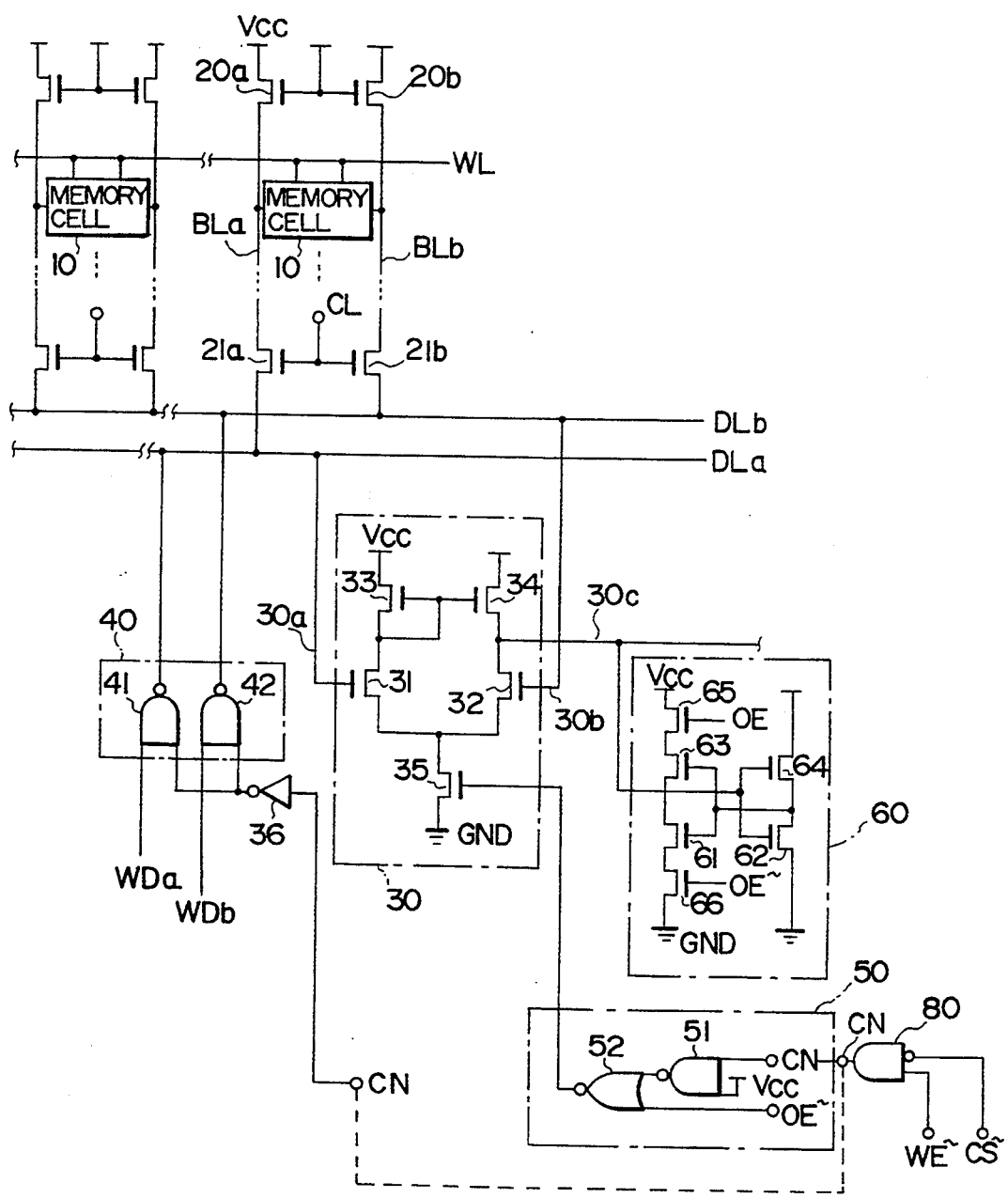
FIG. 1 is a diagram of a circuit of an SRAM according to a preferred embodiment of the invention.
Figure 4:
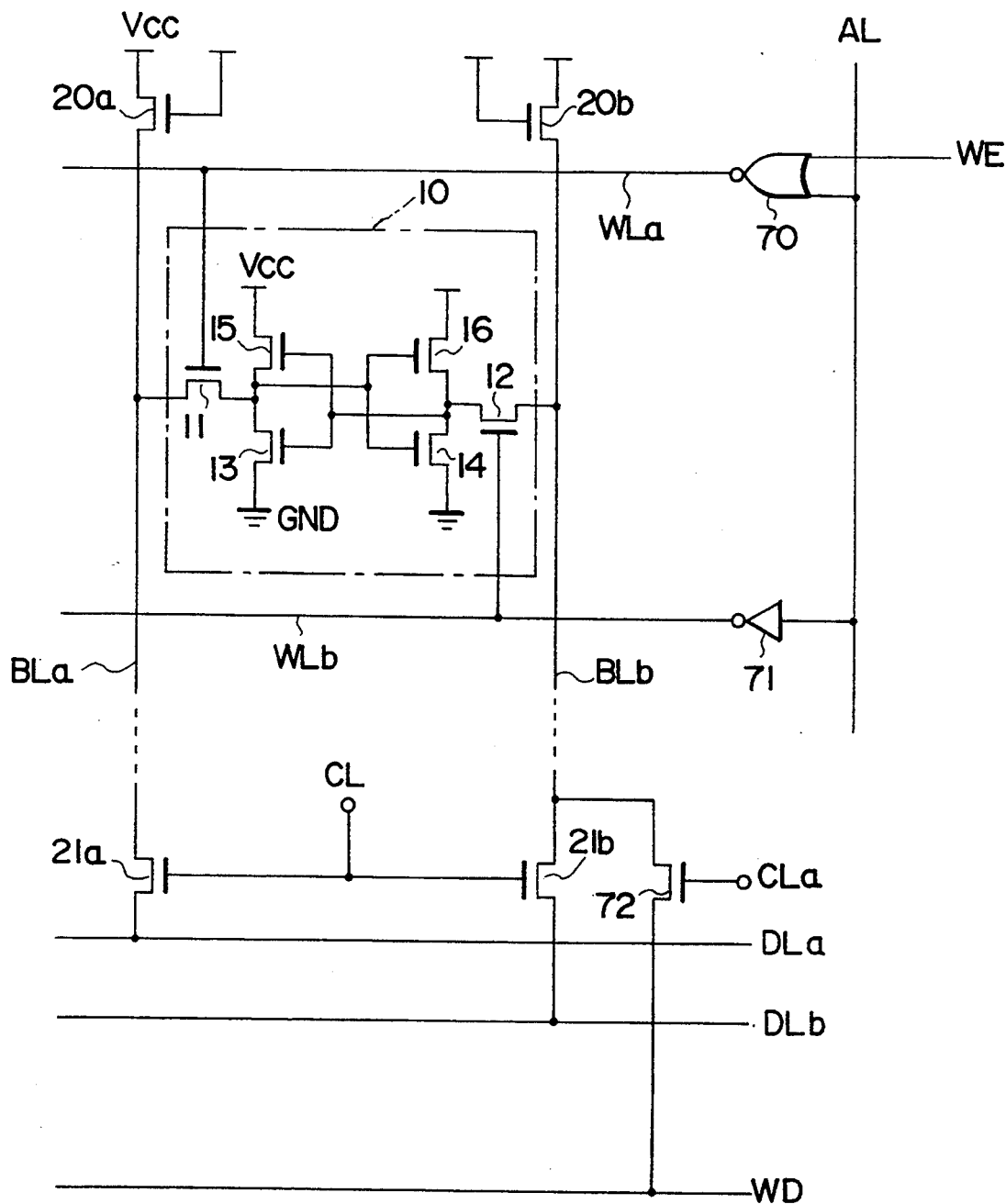
FIG. 4 is a circuit diagram of an essential circuit of an SRAM of another preferred embodiment of the invention.
Figure 7:
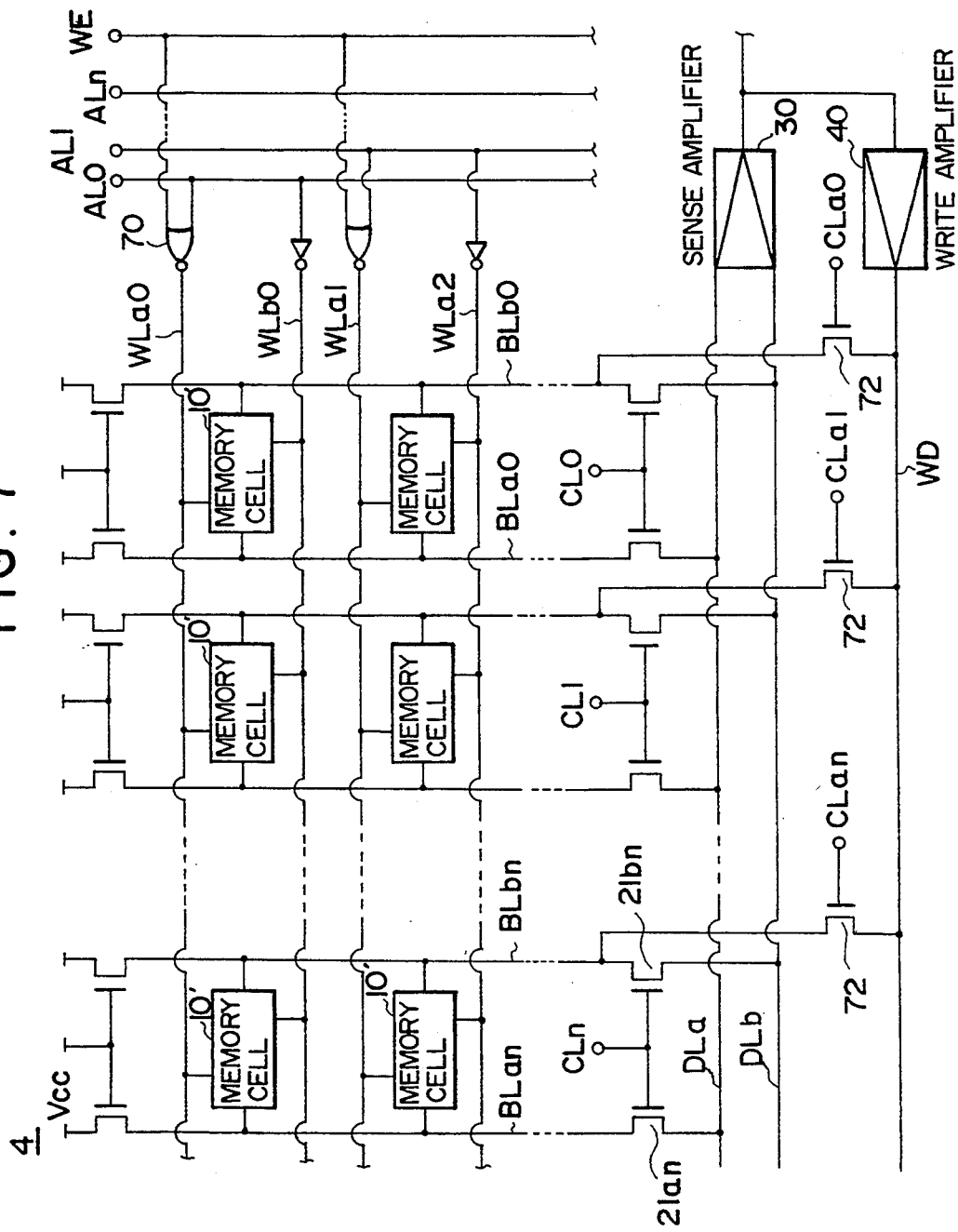
FIG. 7 is a schematic diagram of a memory cell array according to the invention.

The SRAM'S of the preferred embodiments of the invention, as illustrated in detail in FIGS. 1 and 4, include memory cells in a conventional matrix array at intersections of bit-lines and word-lines such as illustrated schematically in FIG. 7.

Referring to the drawings in detail, in particular, to FIG. 1, an SRAM according to a preferred embodiment of the invention is shown.

Figure 6:
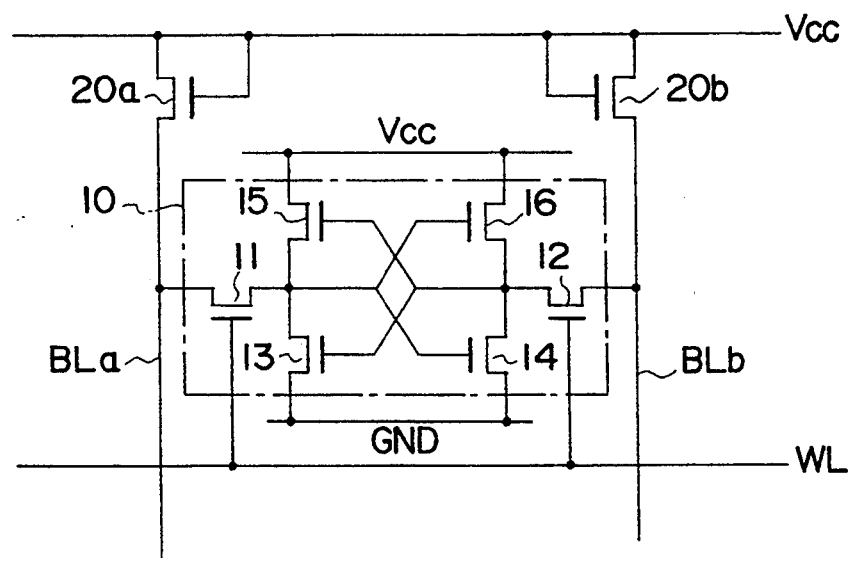
FIG. 6 is a circuit diagram of a memory cell for use in the SRAM of FIG. 1.

The SRAM includes a matrix array of memory cells 10 on a semiconductor chip, only one of which is illustrated in detail in FIG. 1, for ease of understanding. Each memory cell 10 is formed in a manner well known to those skilled in the art, such as is illustrated in FIG. 6, to include as a storage circuit a flip-flop formed of, for example, a pair of NMOS transistors 13, 14, and a pair of PMOS transistors 15, 16, and also to include a pair of transfer gates formed of NMOS transistors 11, 12. In each memory cell 10, the flip-flop is connected by the transfer gates 11, 12 to a pair of bit-lines BLa, BLb, respectively. Each memory cell 10 is also connected to a corresponding word-line WL, a voltage level of which is shifted to a high level (HIGH) at a time that the word-line WL is selected by a X-decoder (not shown). The word-lines WL are disposed so as to intersect a plurality of pairs of the bit-lines BLa, BLb.

One end of the bit-lines BLa, BLb is connected to a power supply line for providing a voltage level Vcc, through a pair of NMOS transistors 20a, 20b. The other ends of the respective bit-lines BLa, BLb are connected to a pair of data-lines DLa, DLb through a pair of transfer gates or column gates, consisting of a pair of NMOS transistors 21a, 21b. The transfer gates 21a, 21b are turned on (active) and off (inactive) by a signal on the column line CL. The data-lines DLa, DLb also may be connected to other bit-line pairs (not shown), when selected by respective signals on other column lines (not shown).

The data-lines DLa, DLb are connected to the respective inputs 30a, 30b of a sense amplifier 30 for amplifying the voltage difference between the two lines. The sense amplifier 30 includes NMOS transistors 31 and 32 connected so as to form a differential pair. That is, the transistor 31 has its gate connected to the input 30a, and the transistor 32 has its gate connected to the input 30b and its source is connected to the source of transistor 31. The sense amplifier 30 also includes a pair of PMOS transistors 33, 34 serving as a current mirror circuit, connected between the line of power supply voltage Vcc defining one binary level fed to the device, and the drains of the respective NMOS transistors 31, 32. An NMOS transistor 35 of the sense amplifier 30 is connected between a ground potential GND (the other binary level fed to the device) and the commonly connected sources of the NMOS transistors 31, 32. The NMOS transistor 35 serves as a switch of the sense amplifier 30, and is controlled by a logic signal applied to its gate. The NMOS transistor 35, when active, also serves as a constant current source. The output 30c of the sense amplifier 30 is provided at the drain of the NMOS transistor 32.

A control circuit 50 is a logic circuit that produces the logic signal for turning the sense amplifier 30 on (active) and off (inactive) in response to a control signal CN and an output enable signal OE~ (active low). The control signal CN is produced by another logic circuit 80, from a write enable signal WE~ (active low) and a chip select signal CS~ (active low). For example, the control signal CN goes HIGH at a time that the write enable signal WE~ goes HIGH, indicating the read operation or cycle, while the chip select signal CS~ is LOW, indicating that the chip is selected. The control signal CN goes LOW at a time that the write enable signal WE~ goes LOW, indicating the write operation or cycle while the chip select signal CS~ is LOW. When the chip select signal CS~ is HIGH, since this means the chip is not selected, the control signal CN stays LOW. The output enable signal OE~ is a signal which, when LOW (active), permits data to go to the output terminals of the chip. When the output enable signal OE~ is HIGH (inactive), the output of the chip is disabled and is in a floating state.

The control circuit 50 includes a NAND gate 51 and a NOR gate 52. The NAND gate 51 has two inputs; one input is for receiving the power supply voltage Vcc and the other input is for receiving the control signal CN. The output of the NAND gate 51 is connected to one of the inputs of the NOR gate 52. The other input of the NOR gate 52 receives the output enable signal OE~.

The logic level of the output of the NAND gate 51 is always opposite to the logic level of the control signal CN. Accordingly, when the control signal CN is LOW, the output of the NAND gate 51 goes HIGH, and when the control signal is HIGH, the output of the NAND gate 51 goes LOW. At the NOR gate 52, only when both inputs are LOW does the output go HIGH. Therefore, only when the output enable signal OE~ is LOW and the control signal CN is HIGH, will the output of the control circuit 50 shift to HIGH, to activate the sense amplifier 30.

The output 30c of the sense amplifier 30 is connected to a latch circuit 60. The latch circuit 60 serves to latch the output of the sense amplifier 30 even after the sense amplifier 30 becomes inactive. The latch circuit 60 includes cross-coupled inverters, or a flip-flop, composed of a pair of PMOS transistors 63, 64 and a pair of NMOS transistors 61, 62. The latch circuit 60 also includes a transistor pair, including PMOS transistor 65 and NMOS transistor 66, for performing a switching operation. The PMOS transistor 65 is connected between the power supply voltage Vcc and the source of the PMOS transistor 63. The NMOS transistor 66 is connected between a line to the ground potential GND, and the source of the NMOS transistor 61. The gate of the PMOS transistor 65 is controlled by an inverted output enable signal OE, and the gate of the NMOS transistor 66 is controlled by the output enable signal OE~. Accordingly, when the output enable signal OE~ is HIGH (so that the inverted output enable signal OE is LOW), indicating the inactive mode of the chip's output, the latch circuit 60 is activated to latch the output level (amplified data) of the sense amplifier 30. In contrast, when the output enable signal OE~ is LOW, indicating the active mode of the chip's output, the latch circuit 60 is controlled to be inactive.

A write driver 40 is connected to the pair of data-lines DLa, DLb to write the data, from write data-lines WDa, WDb to the memory cells 10, through the data-line pair and the corresponding bit-line pair. The write driver 40 includes two NAND gates 41, 42. One of two inputs of each of the two NAND gates receives an inverted control signal $CN_N$, the control signal CN having been inverted by an inverter 36. The other NAND gate inputs are connected to the respective write data-lines WDa, WDb. The write driver 40 delivers data to the data-line pair only when the control signal CN is LOW.

Figure 2:
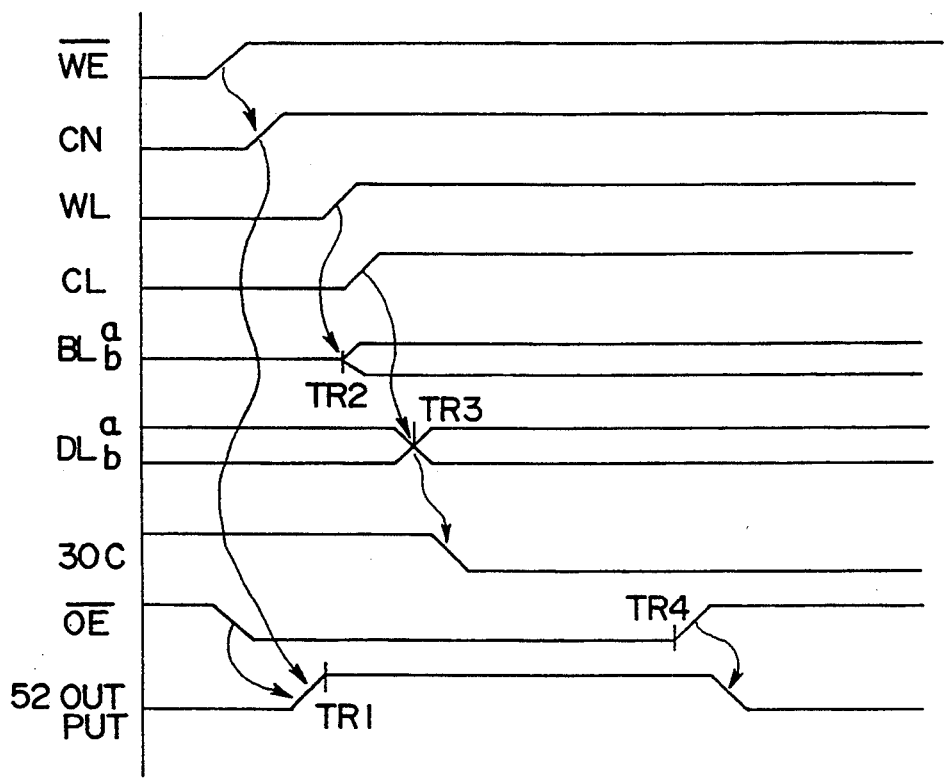
FIG. 2 is a timing diagram illustrating the read operation of the SRAM of FIG. 1.

The read and write operations of the SRAM are now described with reference to both the timing diagrams of FIGS. 2 and 3, and the function table of FIG. 8. To perform the read operation, first of all, the write enable signal WE~ (active low) shifts to HIGH, and the output enable signal OE~ (active low) shifts to LOW, while the chip select signal CS~ (active low), not shown, is LOW. Since the control signal CN follows the level of the write enable signal WE~, the control signal CN goes HIGH.

At the control circuit 50, the output of the NAND gate 51 shifts to LOW according to the shift of the control signal CN. The output of the NOR gate 52 shifts to HIGH since both inputs thereof receive signals which are at LOW. When the output of the NOR gate 52 shifts to HIGH, the NMOS transistor 35 is turned on, thereby turning on the sense amplifier 30 at a time TR1 in FIG. 2.

Then, according to an address signal addressed to one memory cell of the SRAM, the word-line WL and the column gates 21a, 21b are activated to select the one memory cell, stored data of which is to be read. That is, after the address signal is decoded by a Y-decoder, not shown, the level of one of the word-lines WL is shifted to HIGH, thereby turning the transfer gates of the corresponding row of memory cells 10, to a conducting state. Through the conducting transfer gates of the cells 10, the stored data is provided on the corresponding bit-line pair at time TR2. Similarly, one pair of column gates 21a, 21b, corresponding to the address data decoded by an X-decoder, not shown, is turned to a conducting state, so that the data on the corresponding bit-line pair is provided on the data-line pair at time TR3. The sense amplifier 30, now active, then amplifies the data on the data-lines DLa, DLb and delivers the data with a gain, to the sense amplifier output 30c. FIG. 2 shows an example in which the read data on the output line 30c, is LOW, or "0". The data amplified by the sense amplifier is delivered to the output of the SRAM in a manner well known to those skilled in the art.

While the output enable signal OE~ is LOW, the latch circuit 60 is maintained in an inactive state, since the pair of MOS transistors 65, 66 are cut off. At time TR4, if the output enable signal OE~ shifts to HIGH, which indicates a floating state at the output of the SRAM, the output of the NOR gate 52 goes LOW. Consequently, the NMOS transistor 35 is turned off, thereby forcing the sense amplifier 30 to become inactive. This period of inactivity of the sense amplifier 30 while the device output floats, reduces the power consumption of the SRAM.

At the same time, the MOS transistors 65, 66 of the latch circuit 60 become conducting, as a result of the change in the level of the output enable signal OE~. The latch circuit 60 therefore starts latching the data at the sense amplifier output 30c. This operation of the latch circuit 60 prevents the output enable access time $T_{oe}$ from being lengthened, even with the forced inactivity of the sense amplifier 30 for the sake of saving energy in the SRAM.

Figure 3:
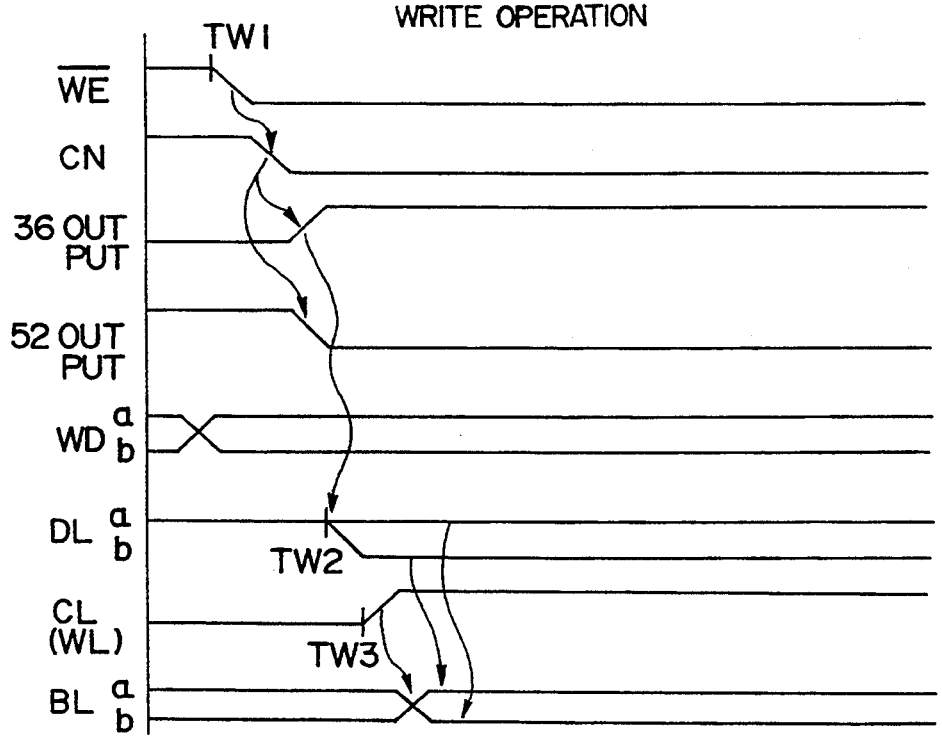
FIG. 3 is a timing diagram illustrating the write operation of the SRAM of FIG. 1.

During the write operation of the SRAM, the write enable signal WE~ shifts from HIGH to LOW at time TW1 as shown in FIG. 3. As a result, the control signal CN follows this shift of the write enable signal WE~, by shifting to LOW, and the inverted control signal $CN_N$, which is output of the inverter 36, goes HIGH. The output of the control circuit 50 goes LOW despite the level of the inverted output enable signal OE~, since the control signal CN is LOW. As a result, the sense amplifier 30 turns inactive.

The data delivered to the write driver 40 through the write data-lines WDa, WDb is further delivered to the data-lines DLa, DLb, when each of the NAND gates 41, 42 receives the HIGH inverted control signal. Upon receiving the data at time TW2, one of the data-lines DLa, DLb experiences a shift from HIGH to LOW, by operation of the write driver 40. As a result, the voltage difference between the data-lines increases.

Then, the column gates 21a, 21b and the word-line WL that correspond to the address signal given to the SRAM, are selected. The corresponding memory cell 10 then receives the data from the data-lines DLa, DLb through the bit-line pair BLa, BLb and the transfer gates 11, 12, and stores the data therein.

The SRAM can operate with lower power consumption, since the sense amplifier 30 is controlled by the output enable signal OE~ in addition to the control signal CN, and is maintained inactive while the output of the SRAM is in the floating state. Moreover, since the latch circuit 60 holds the data at the output of the sense amplifier 30, the SRAM can be operated at reduced power consumption and with a short output enable access time $T_{oe}$.

Referring now to FIG. 4, an SRAM according to another preferred embodiment of the invention is shown. The SRAM includes a matrix array of memory cells 10' (arranged as illustrated in FIG. 7), only one of the cells being shown in FIG. 4, for the sake of simplicity. Each memory cell 10' has a storage circuit in the form of a flip-flop composed of a pair of PMOS transistors 15, 16 and a pair of NMOS transistors 13, 14, as in a typical conventional CMOS SRAM memory cell. The memory cell 10' also includes a further pair of NMOS transistors 11, 12, serving as transfer gates. The NMOS transistor 11 is connected between the flip-flop and a first bit-line BLa. The gate of the NMOS transistor 11 is connected to a first word-line WLa. The NMOS transistor 12 is connected between the flip-flop and a second bit-line BLb. The bit-lines BLa, BLb together form a bit-line pair. The gate of the NMOS transistor 12 is connected to a second word-line WLb provided in parallel to the first word-line WLa. In this SRAM, plural pairs of the first and second word-lines WLa, WLb are disposed so as to intersect a plurality of bit-line pairs BLa, BLb. The bit-lines and word-lines are similarly connected to all of the memory cells in the matrix, to allow any one of the memory cells to be selected and accessed in accordance with an address signal received by the SRAM.

One end of each of the bit-lines BLa, BLb is connected to a power supply line, for providing a voltage level Vcc through a pair of NMOS transistors 20a, 20b. Transistors 20a, 20b are provided as a load for the bit-lines, as with the SRAM of the previously-described embodiment. The other ends of the bit-lines BLa, BLb are connected to respective data-lines DLa, DLb, through respective transfer gates 21a, 21b, or column gates, in the form of NMOS transistors. The transfer gates 21a, 21b are turned on and off by a signal on a column line CL. In addition to the transfer gates 21a, 21b, another transfer gate 72, composed of an NMOS transistor, is connected between the other end of the second bit-line BLb and a single write data-line WD.

The write data-line WD is connected to a write driver not shown. The transfer gate 72 is controlled to be turned on by a signal on a write column line CLa, only during the write operation. The data-line pair composed of the data-lines DLa, DLb, and the write data-line WD, are connected to other bit-line pairs, not shown, but selected by respective signals on other column lines CL or other write column line CLa. The data-line pair is connected to a sense amplifier, not shown. The data amplified by the sense amplifier is delivered to the output of the SRAM in a manner well known to those skilled in the art.

The word-lines WLa, WLb carry transfer gate controlling signals for controlling the transfer gates 11 and 12 to be on (active) or off (inactive). An address line AL is connected to the first and second word-lines WLa, WLb, through a cell selection circuit. The cell selection circuit is composed of logic gates in the form of a NOR gate 70 and an inverter 71, and functions to select one of memory cells 10', by turning on one or both of its transfer gates 11, 12.

The first word-line WLa is connected to the address line AL through the NOR gate 70. That is, one input of the NOR gate 70 receives an inverted write enable signal WE, which has a phase reversed to that of the write enable signal $WE_N$ (active low), and the other input of the NOR gate 70 is connected to the address line AL. The output of the NOR gate 70 is connected to the first word-line WLa.

The level of the address line AL becomes LOW when selected and HIGH when not selected. When the write operation is enabled and the address line AL is selected, the inverted write enable signal WE is HIGH and the level of line AL is LOW. The first word-line WLa must be LOW according to the operation of the NOR gate 70. Therefore, during the write operation, the NMOS transistor 11, controlled by the transfer gate controlling signal on the first word-line WLa, is held in a non-conducting state.

By contrast, the inverter 71 is connected between the address line AL and the second word-line WLb. The level of the second word-line WLb becomes HIGH when selected, and is LOW when not selected, notwithstanding the write operation and the read operation of the SRAM, since the level of the address line AL is merely inverted at the inverter 71.

During a read operation, the write enable signal $WE_N$ shifts to HIGH, so that the NOR gate 70 acts as an inverter. This allows the memory cells 10' to be read out in the same fashion as that of the ordinary SRAM. When the level of the address line AL becomes LOW to select the corresponding memory cell 10', both the first word-line WLa and the second word-line WLb go HIGH. This causes the transfer gates 11, 12 to become conducting. Therefore, the data stored in the corresponding memory cell 10' appears on the data-lines DLa, DLb through the corresponding bit-line pair BLa, BLb, selected by the signal on the column line CL. The sense amplifier, not shown, then amplifies the data in the data-lines DLa, DLb, and the data is read out from the SRAM.

Figure 5:
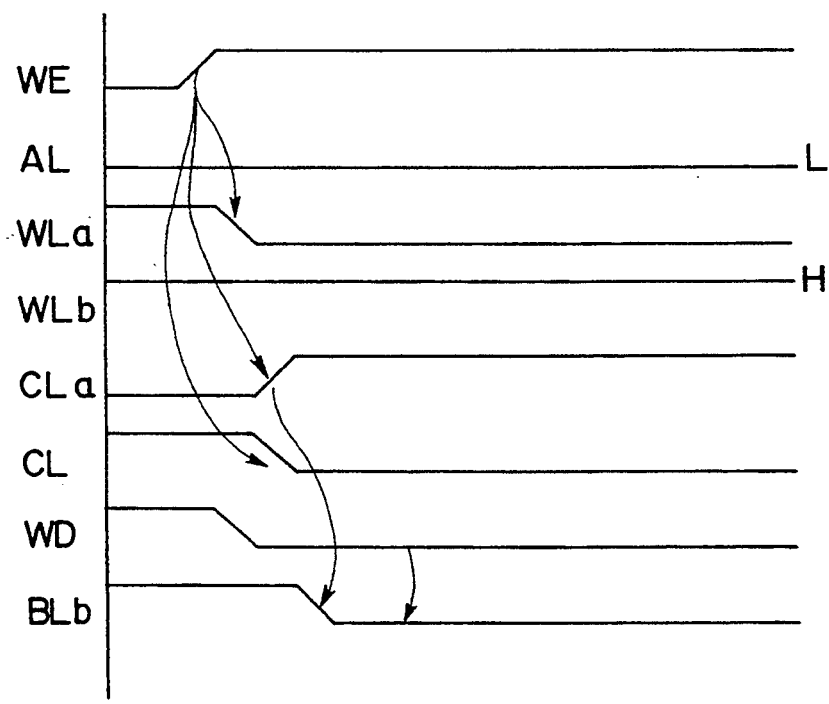
FIG. 5 is a timing diagram illustrating the write operation of the SRAM of FIG. 4.

Referring now to FIG. 5, during a write operation of the SRAM shown in FIG. 4, the write enable signal WE~ shifts from HIGH to LOW (the inverted write enable signal WE shifts from LOW to HIGH). Prior to the shift, and according to the address signal given to the SRAM, the level of the corresponding address line AL has become LOW. Therefore, when the inverted write enable signal WE shifts to HIGH, the level of the second word-line WLb is maintained HIGH by its connection to the corresponding address line AL through the inverter 71.

However, the level of the first word-line WLa shifts to LOW. This is because the HIGH level of the inverted write enable signal WE~ causes the output of the NOR gate 70 to switch LOW, despite the HIGH level of the address line AL. The LOW on the first word-line WLa holds NMOS transistor 11 non-conducting. Therefore, the NMOS transistor 11 is non-conducting during the write operation. As a result, the first bit-line BLa is never used during the write operation.

In the accessed memory cell 10', the NMOS transistor 12 is held conducting by the second word-line WLb. The transfer gates 21a, 21b for column selection are forced to be non-conducting by the signal on the column line CL. However, the transfer gate 72 is turned on by the signal in the corresponding write column line CLa. Accordingly, while the data-lines DLa, DLb are disabled, the write data-line WD is connected to the second bit-line BLb, thereby sharing data with the second bit-line BLb. The data on the second bit-line BLb is further transferred to the flip-flop of the corresponding memory cell 10' through the conducting transfer gate 12. In the timing diagram of FIG. 5, the shift in signal level on the bit-line BLb from HIGH to LOW shows the transferred data to be LOW, or "0".

In this SRAM, only one bit-line of the bit-line pair is used for writing data. Therefore, at a time of transition from a write operation to a read operation, only one of the bit-lines connected to the memory cell 10' is charged or discharged. Therefore, such an operation has a reduced chance, as compared to the prior art, of destroying the data stored in the memory cell 10', since the amount of electrical charging or discharging is less than that which occurs in a conventional SRAM. Moreover, since the write recovery is quickly performed, the SRAM of the invention can switch promptly from a write operation to a read operation. Therefore, the SRAM can operate at a high speed.

It is to be noted that the applicant contemplates various modifications of the preferred embodiments in a semiconductor integrated circuit according to the invention. For example, the memory cell 10, or 10', the sense amplifier 30, or the latch circuit 60 may be formed of another type of transistor structure. The control circuit 50 or the NOR gate 70 may include a gate or gates of another type. The NMOS transistor 72 may be formed by a transistor of another type. Although in the embodiments described above, the semiconductor integrated circuit device is an SRAM, the semiconductor integrated circuit device according to the invention could be a memory of another type, or a device, such as a microprocessor or the like, that includes such a memory.

According to a further aspect of the invention, the arrangement shown in FIG. 4 may include as a sense amplifier the sense amplifier 30 of FIG. 1. Moreover, such a circuit, including the sense amplifier circuit 30, may be further provided with the logic circuit 50 and latch circuit 60, shown in FIG. 1, in order to provide further savings of power consumption, and increased operating speed.

It is understood that although the invention has been described in detail with respect to preferred embodiments thereof, various other embodiments and variations will be recognized by those skilled in the art which fall within the scope and spirit of the invention, and such other embodiments and variations are intended to be covered by the following claims.

What is claimed is:

1. A semiconductor integrated circuit device, an output of the device being in a floating state in response to an output enable signal fed to the device, the device comprising:
   a plurality of word-lines;
   a plurality of bit-line pairs, disposed so as to intersect said word-lines;
   a plurality of memory cells, each connected to one of said word-lines and to one of said bit-line pairs;
   a sense amplifier having an active state and an inactive state, said sense amplifier being connected to a selected one of said bit-line pairs, said sense amplifier amplifying a voltage difference between the bit-lines of the selected bit-line pair when said sense amplifier is in the active state; and
   a logic circuit, responsive to a control signal and the output enable signal, for providing a logic signal that controls said sense amplifier to be in the active state and the inactive state.

2. A semiconductor integrated circuit device according to claim 1, wherein said logic circuit is responsive to the control signal to control said sense amplifier to be active when the control signal has a first state, and to be inactive when the control signal has a second state, further comprising a control signal producing circuit, responsive to first and second states of a write enable signal, respectively for producing the first and second states of the control signal, the first and second states of the write enable signal being indicative that the device is in respectively a read operation for reading from the memory cells and a write operation for writing into the memory cells.

3. A semiconductor integrated circuit device according to claim 2, wherein said control signal producing circuit is further responsive to a predetermined state of a chip select signal, the predetermined state of the chip select signal indicative that a chip of the device is selected, said control signal producing circuit producing the first state of the control signal only when the chip select signal has the predetermined state.

4. A semiconductor integrated circuit device according to claim 1, wherein said logic circuit is responsive to the control signal to control said sense amplifier to be active when the control signal has a predetermined state, wherein a first level of the output enable signal is indicative that the output of the device is in the floating state, and wherein a second level of the output enable signal is not indicative that the output of the device is in the floating state, said logic circuit being responsive to the predetermined state of the control signal and the second level of the output enable signal to control said sense amplifier to be active.

5. A semiconductor integrated circuit device according to claim 1, further comprising a data-line pair, and respective pairs of column gates disposed between the bit-line pairs and said data-line pair, wherein each of the pairs of column gates is disposed between a corresponding one of the bit line pairs and said data line pair, and selectively connects said sense amplifier to the corresponding one of said bit-line pairs through said data-line pair.

6. A semiconductor integrated circuit device according to claim 5, wherein said sense amplifier comprises:

a pair of MOS transistors having commonly connected sources, and gates connected to the bit-lines of the selected bit-line pair, a current mirror circuit connected between one binary level fed to the device and said pair of MOS transistors, and a switch connected between the other binary level and said commonly connected sources, said switch being controlled by the logic signal.

7. A semiconductor integrated circuit device according to claim 1, further comprising a latch circuit connected to an output of said sense amplifier.

8. A semiconductor integrated circuit device according to claim 7, wherein said latch circuit is controlled by the output enable signal.

9. A semiconductor integrated circuit device according to claim 8, wherein said latch circuit is responsive to the output enable signal to latch amplified data output by said sense amplifier at a time that the output enable signal shifts to a level at which the output of the device shifts to the floating state.

10. A semiconductor integrated circuit device according to claim 1, wherein each memory cell comprises a flip-flop and a pair of transfer gates.

11. A semiconductor integrated circuit device according to claim 1, wherein each memory cell comprises MOS transistors.

12. A semiconductor integrated circuit device according to claim 1, wherein said logic circuit is responsive to a state of the control signal to control said sense amplifier to be inactive, the output enable signal having a state indicating that the output of the device is floating, said logic circuit being further responsive to said state of the output enable signal to control said sense amplifier to be inactive.

13. A semiconductor integrated circuit device according to claim 1, wherein the output enable signal has a float state indicating that the output of the device is floating, said control signal having a write state indicating that the device is in a write operation for writing into the memory cells, said logic circuit being responsive to the control signal to control said sense amplifier to be inactive whenever the control signal is in the write state, said logic circuit being further responsive to said output enable signal to control said sense amplifier to be inactive whenever the output enable signal is in the float state.

14. A semiconductor integrated circuit device according to claim 1, further comprising a latch circuit connected to an output of said sense amplifier, said latch circuit being controlled by the output enable signal, wherein the output enable signal has a state indicating that the output of the device is floating, said logic circuit being responsive to said state of the output enable signal to control said sense amplifier to be inactive, said latch circuit having latching means, responsive to said state of said output enable signal, for latching a signal on the output of said sense amplifier.

15. A semiconductor integrated circuit according to claim 1, wherein the logic signal provided by the logic circuit controls the sense amplifier to be in the inactive state when the output enable signal has a predetermined level such that the output of the integrated circuit device is in the floating state.

16. A method of performing read operations and write operations in a semiconductor integrated circuit device, the device including a plurality of word-lines, a plurality of bit-line pairs, disposed so as to intersect the word-lines, a plurality of memory cells, each connected to one of the word-lines and to one of the bit-line pairs, a sense amplifier, selectively activatable by connection to one of the bit-line pairs, for amplifying a voltage difference between the bit-lines of the one of the bit-line pairs during the read operations, and a device output having a floating state when and only when an output enable signal, having alternative first and second output enable levels, is applied to the device at the first output enable level, the method comprising the steps of:

a. applying the output enable signal at the first output enable level, to the device, during first selected time periods of the read operations;

b. applying the output enable signal at the second output enable level, to the device, during time periods other than the first selected time periods;

c. providing the device output in the floating state only while the output enable signal is applied to the device at the first output enable level;

d. providing a control signal having at different times, respectively a first control level and a second control level; and e. activating the sense amplifier when, and only when the control signal has the first control level and the output enable signal has the second output enable level.

17. A method according to claim 16, wherein said step d comprises the steps of:

providing a write enable signal having a first write enable level during the write operations;

providing the write enable signal at a second write enable level during the read operations; and providing the control signal at the first control level only while the write enable signal has the second write enable level.

18. A method according to claim 17, further comprising the steps of:

selecting a chip of the device during second selected time periods;

providing a chip select signal at a first chip selection level during the second selected time periods; and providing the chip select signal at a second chip selection level during time periods other than the second selected time periods;

said step d including providing the control signal at the first control level only while the chip select signal is at the first chip selection level.

19. A method of performing read and write operations in a semiconductor integrated circuit device, according to claim 16, wherein said step e comprises the step of activating the sense amplifier when and only when (i) a chip of the device is selected, (ii) the device is in a read operation, and (iii) the device output is not in the floating state.

* * * * *